(12) United States Patent
Gans

(10) Patent No.: US 6,965,255 B2
(45) Date of Patent: *Nov. 15, 2005

(54) METHOD AND APPARATUS FOR AMPLIFYING A REGULATED DIFFERENTIAL SIGNAL TO A HIGHER VOLTAGE

(75) Inventor: Dean D. Gans, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/901,644

(22) Filed: Jul. 28, 2004

(65) Prior Publication Data

US 2005/0002250 A1 Jan. 6, 2005

Related U.S. Application Data

(63) Continuation of application No. 10/293,023, filed on Nov. 12, 2002, now Pat. No. 6,812,746.

(51) Int. Cl.⁷ .................................................. G11C 7/00
(52) U.S. Cl. ............................ 327/51; 327/52; 365/154
(58) Field of Search ...................... 327/51–57; 365/154, 365/190, 205, 207

(56) References Cited

U.S. PATENT DOCUMENTS

| | | |
|---|---|---|
| 4,843,264 A | 6/1989 | Galbraith |
| 5,228,106 A | 7/1993 | Ang et al. |
| 5,502,680 A | 3/1996 | Du et al. |
| 5,552,728 A | 9/1996 | Lin |
| 5,646,905 A | 7/1997 | Pogrebnoy |
| 5,673,226 A | 9/1997 | Yumitori et al. |
| 5,699,305 A | 12/1997 | Kawashima |
| 5,850,359 A | 12/1998 | Liu |
| 5,903,171 A | 5/1999 | Shieh |
| 6,072,727 A * | 6/2000 | La Rosa ................. 365/189.01 |
| 6,111,812 A | 8/2000 | Gans et al. |
| 6,161,204 A | 12/2000 | Gans |
| 6,304,511 B1 | 10/2001 | Gans et al. |
| 6,317,381 B1 | 11/2001 | Gans et al. |
| 6,388,926 B1 | 5/2002 | Gans et al. |
| 6,396,310 B2 | 5/2002 | Shin |
| 6,501,302 B1 | 12/2002 | Lee et al. |
| 6,507,224 B1 | 1/2003 | Lee et al. |
| 6,525,572 B1 * | 2/2003 | Barnes ......................... 327/52 |
| 6,812,746 B2 * | 11/2004 | Gans ............................. 327/51 |
| 2002/0004892 A1 | 1/2002 | Gans et al. |
| 2002/0051391 A1 | 5/2002 | Gans et al. |

* cited by examiner

Primary Examiner—Dinh T. Le
(74) Attorney, Agent, or Firm—TraskBritt, PC

(57) ABSTRACT

A sense amplifier for use in a memory device and in a memory-resident system. The sense amplifier operates on a lower voltage consistent with the voltage range of the differential input data and the sense amplifier further operates on a higher voltage to level-shift the output signal concurrently with the sensing operation. The sense amplifier includes a pair of differential cross-coupled inverters whose inputs are coupled to receive the data from the memory. Once the input nodes of the cross-coupled inverters are charged, the cross-coupled inverters are further coupled to pull-up and pull-down circuits that span the higher voltage range for performing the level-shifting functionality. In order to recondition the sense amplifier for a subsequent sensing process, a clamp circuit shorts the level-shifted outputs together to prevent a higher voltage level from being inadvertently passed to the memory device when isolating pass gates are reactivated.

24 Claims, 7 Drawing Sheets

METHOD AND APPARATUS FOR AMPLIFYING A REGULATED DIFFERENTIAL SIGNAL TO A HIGHER VOLTAGE

CROSS-REFERENCE TO RELATED APPLICATION

This application is a continuation of application Ser. No. 10/293,023, filed Nov. 12, 2002, now U.S. Pat. No. 6,812,746.

BACKGROUND OF THE INVENTION

1. Field of the Invention

The present invention relates generally to timing in semiconductor memory devices and, more particularly, to signal sensing and level-shifting within semiconductor memory devices.

2. State of the Art

Semiconductor memory devices are used in a myriad of applications. Such memory devices receive data for storage during a write operation and provide stored data to devices or systems external to the memory device during a read operation. Typically, a memory device is accessed through a bus which is controlled by a microprocessor or other digital control mechanism.

As the density of fast memory devices, such as static MOS random access memories (SRAM), increases, it becomes increasingly more difficult to utilize existing memory components. FIG. 1 illustrates a block diagram of an exemplary prior art circuit which includes various componentry utilized in a memory application. FIG. 1 illustrates a memory cell 10 which may be a portion of a generally inclusive memory array of memory cells 10. By way of simplification, the associated timing and control as well as other routing signals associated with a memory array are not depicted in FIG. 1 so as to better isolate the shortcomings of the prior art. Memory cell 10 outputs differential output signals DIN and /DIN to a conventional sense amplifier 12. The sense amplifier depicted in FIG. 1 is typical of a sense amplifier resident on a memory module or system which utilizes lower voltages, illustrated as VCCR, due to the reduced architecture dimensions of memory cell 10. Therefore, sense amplifier 12 receives the data signals and, upon sensing the respective differential relationship of the input signals, generates output signals, illustrated in FIG. 1 as DOUT and /DOUT.

Because the data information retrieved from memory cell 10 is utilized by external devices operating at typically higher voltage levels, the system as illustrated in FIG. 1 further includes a level shifter 14 for receiving the DOUT, /DOUT signals from sense amplifier 12 and converting those signals into compatible voltage output signals illustrated as DOUT' and /DOUT'. In order to perform the level-shifting, level shifter 14 is coupled to an external voltage which is generally a higher voltage illustrated in FIG. 1 as VCCX. In order to make the data available to a computing device, a latch 16 retains the data as retrieved from the memory cell and shifted to the higher voltage level for utilization by a processor or other computational device, illustrated in FIG. 1 as processor 18.

While the architecture illustrated in FIG. 1 accomplishes the objective of retrieving data from a memory cell and presenting the data to a processor for consumption, such an architecture does not lend itself to current speeds associated with both the capability of the memory cell as well as the capability of the processor. For example, there is a finite latency associated with the switching of sense amplifier 12. Additionally, level shifter 14 requires a significant amount of time for boosting the signal level. It is not uncommon for memory access times to be on the order of 4 nanoseconds, with separate level-shifting alone requiring more than 10% of that time. Accordingly, there exists a need to minimize the overall latency associated with the identification and signal level translation resident within a memory module or system.

BRIEF SUMMARY OF THE INVENTION

In summary, the present invention comprises a sensing and level-shifting apparatus and method for application in a time-sensitive environment where mixed voltage componentry coexists and interoperates. One such environment includes the semiconductor memory realm where high-speed memories with very small signals, and hence low operating power, interoperate with higher-powered computer buses and processors. While sensing the presence of a voltage differential and latching a corresponding output with additional drive capability is presented, the sense amplifier of the present invention further integrates level-shifting into the sensing structure and process without the excessive time delays associate with external level-shifting.

In one exemplary embodiment of the invention, the level-shifting sense amplifier includes a differential cross-coupled inverter circuit comprised of a pair of inverters that is cross-coupled (i.e., an input of one coupled to the output of the other, and vice versa). The sense amplifier further provides isolation between the lower voltage of the data source (e.g., semiconductor memory) and the higher voltage level-shifting components. Isolation is performed by coupling a pass gate between the input of each inverter and the corresponding one of the differential data inputs of the sense amplifier. The pass gates are controlled by a control signal that isolates the above-described cross-coupled inverters once their gates are charged to the lower or regulated voltage levels.

In order to perform the level-shifting aspects of the invention, the cross-coupled inverters are further coupled to a pull-up circuit in a pull-up arrangement. The pull-up circuit is comprised of at least one pull-up transistor that may couple to one or both of the cross-coupled inverters with the pull-up circuit also being coupled to the higher voltage that is the target voltage for the level-shifting process. In order to complete the circuit, the sense amplifier further includes a pull-down circuit that includes a pull-down transistor coupled to the pair of cross-coupled inverters in a pull-down arrangement. Both the pull-up and pull-down circuits remain in an open-circuit state until the input nodes of the cross-coupled inverters are charged and the pass gates are opened. Upon such an occurrence, both the pull-up and pull-down circuits close and allow the cross-coupled inverters to switch into a latched status with the signal levels being pulled up to the higher level-shifted voltage.

Following the sensing and level-shifting of the input data, residual high voltage remains on the output and input nodes. If the pass gates repeated a subsequent sensing and level-shifting process, the higher voltage would bleed up into memory cells and potentially cause data upset or result in destruction of the memory device. Therefore, the present invention further includes a clamp circuit which is activated following a sensing and level-shifting process. The clamp circuit shorts the differential outputs together and further pulls them up with pull-up transistors to the lower voltage, namely, the voltage levels as utilized on the memory device.

One particular application of the present invention is with respect to SRAM devices where the latency of external level-shifting impairs the desired memory access speed associated with such a technology. The present invention finds application in further integration into memory systems or devices as well as in computer systems or other computational environments that utilize stored data and require sensing of stored data followed by the level-shifting or signal conditioning prior to interconnection with circuitry utilizing higher voltages. Thus, the sense amplifier of the present invention significantly improves memory access times by providing sensing and level-shifting together in one signal transition process. Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 2:
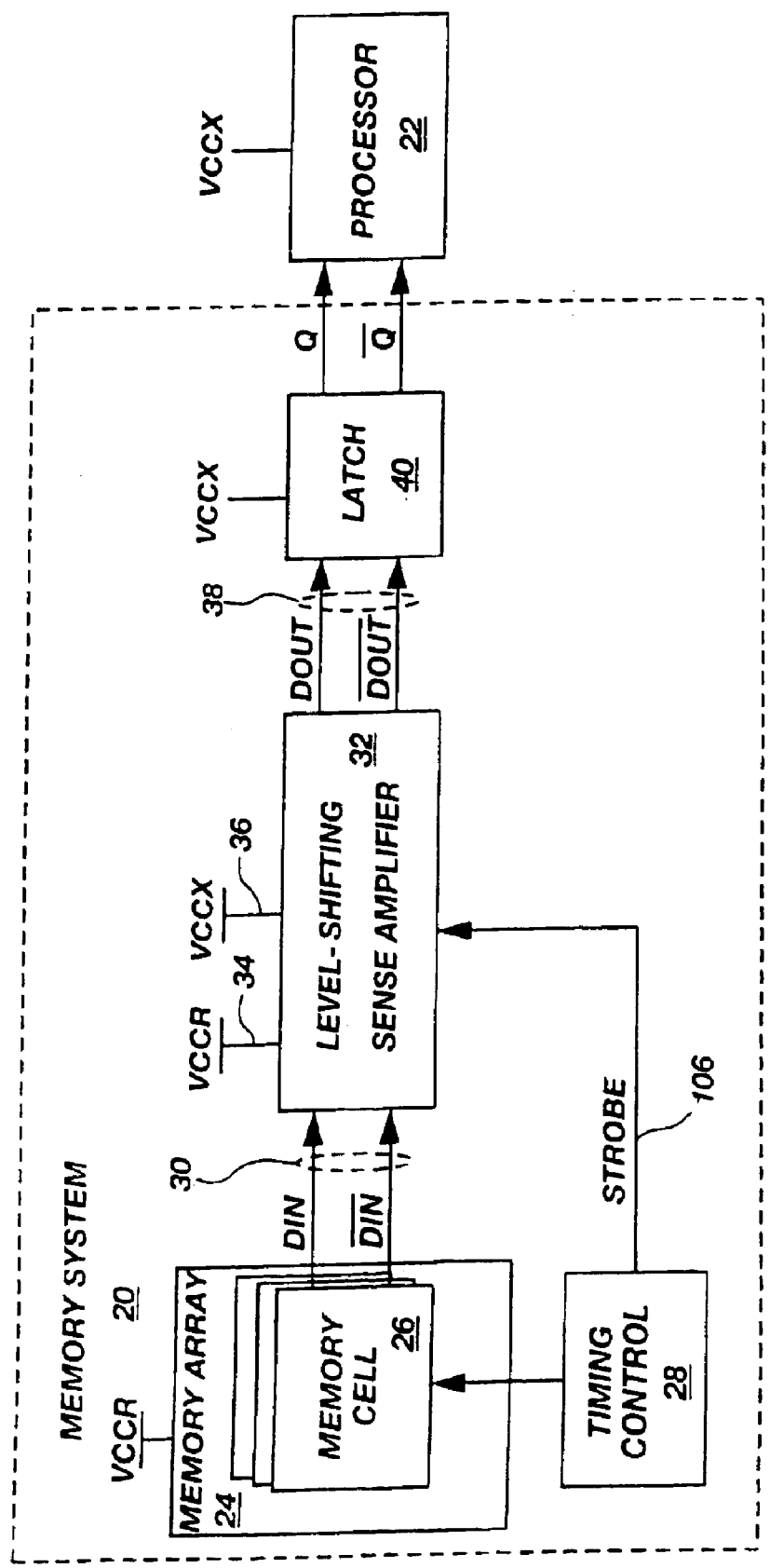
FIG. 2 illustrates a block diagram of a memory device incorporating a sense amplifier, in accordance with an embodiment of the present invention.

FIG. 2 illustrates a memory system 20 as illustrated in block diagram form, in accordance with an exemplary embodiment of the present invention. Memory system 20 generally interfaces with a data-consuming device, illustrated in FIG. 2 as processor 22. It should be appreciated that the interfacing between memory system 20 and processor 22 may further include other interfaces and data paths not illustrated, including buses, latches and other buffering or transport topologies.

Memory system 20 is generally implemented on an integrated circuit device and includes operational components as illustrated. Memory system 20 includes a memory array 24 comprised of at least one memory cell 26. Those of ordinary skill in the art appreciate the composition and architecture associated with memory array 24 as well as memory cells 26. By way of example, memory cell 26 stores data therein which is retrieved under the direction of a timing control block 28 (also referred to herein as "memory control circuit 28") which generates timing signals, namely, a memory read signal, to memory cell 26 for divulgence of the requested data within memory cell 26. As illustrated, memory cell 26 divulges or outputs data in the form of differential signals, illustrated in FIG. 2 as differential data inputs 30. Differential data inputs 30 pass to a level-shifting sense amplifier 32, configured in accordance with the present invention. Level-shifting sense amplifier 32 includes power inputs, namely, regulated power 34, illustrated in FIG. 2 as VCCR, and external power 36, illustrated in FIG. 2 as VCCX. It should be appreciated that as integrated circuit complexities increase and as integrated circuit dimensions decrease, devices utilizing the smaller dimensions operate at generally lower voltage levels, illustrated in FIG. 2 as regulated power 34. However, external devices, such as processor 22, operate at external voltage levels which are generally higher in voltage potential than the regulated power. Therefore, level-shifting of differential data inputs 30 must occur, and does occur, in the present invention within level-shifting sense amplifier 32.

Level-shifting sense amplifier 32 outputs differential data outputs 38 which swing between the signal power range established by external power 36. FIG. 2 illustrates an optional latch 40 which may provide further storage and timing synchronization of data prior to accessing by processor 22. Other similar control devices are contemplated within the scope of the present invention.

Figure 3:
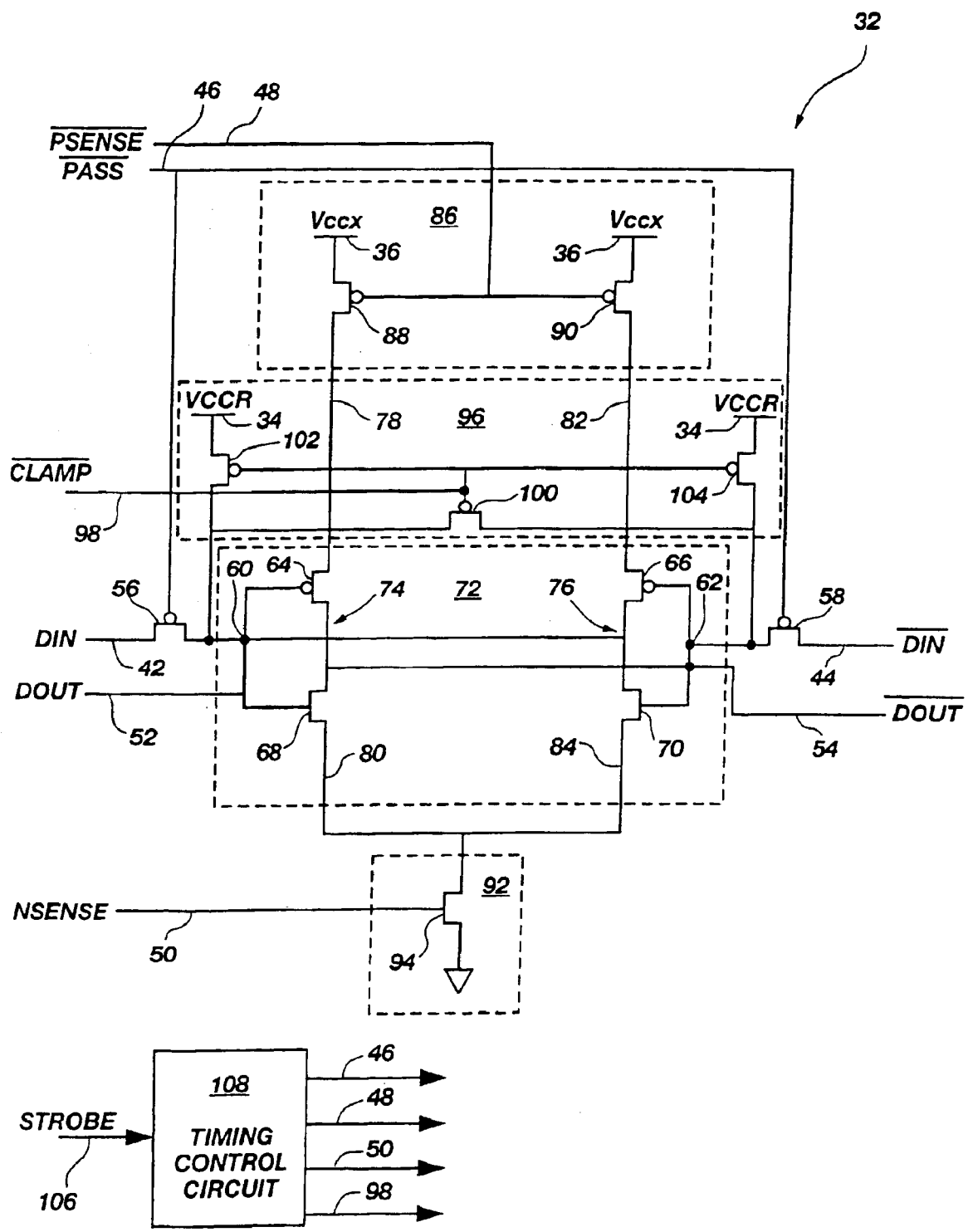
FIG. 3 is a detailed diagram of a sense amplifier, in accordance with an embodiment of the present invention.

FIG. 3 illustrates a sense amplifier 32 for receiving differential data inputs 30 (FIG. 2) illustrated individually in FIG. 3 as first and second differential data inputs 42 and 44 and for generating, in response to control signals 46, 48, and 50, first and second differential data outputs 52 and 54. The logic states of first and second differential data outputs 52 and 54 are determined by a differential voltage between first and second differential data inputs 42 and 44. First and second differential data inputs 42 and 44 are typically received by way of differential data inputs 30 (FIG. 2) as received from a memory cell 26 (FIG. 2), or a similar data source. Additionally, first and second differential data outputs 52 and 54 are interfaced as differential data outputs 38 (FIG. 2) to a latch (e.g., latch 40 of FIG. 2) or other digital circuits such as processor 22 (FIG. 2).

First and second differential data inputs 42 and 44 are received at respective transistors 56 and 58 (also referred to herein as "pass gates 56 and 58") when output from memory cell 26 (FIG. 2). Transistors 56 and 58 are illustrated as being implemented as p-channel transistors operably gated and controlled by pass gate control signal 46. When activated by pass gate control signal 46, transistors 56 and 58 pass first and second differential data inputs 42 and 44, respectively, to nodes 60 and 62, respectively. Upon the transfer of the signals resident on first and second differential data inputs 42 and 44 to their respective nodes 60 and 62, pass gate control signal 46 is deactivated, thereby shutting off transistors 56 and 58 and providing a decoupling of sense amplifier 32 from the load exhibited by the remaining circuitry components attached thereto, namely, memory cell 26 (FIG. 2). Nodes 60 and 62 are respectively coupled to transistors 64, 66, 68, and 70, which together and cooperatively coupled form a differential cross-coupled inverter circuit 72.

Transistors 64 and 66 are preferably implemented as p-channel transistors while transistors 68 and 70 are implemented as n-channel transistors. The differential cross-coupled inverter circuit 72, as mentioned, is preferably formed from first and second cross-coupled inverters 74 and 76, wherein an output of the first inverter 74 is connected to an input of the second inverter 76 and an output of the second inverter 76 is connected to the input of the first inverter 74. The first inverter 74 comprises transistors 64 and transistor 68 wherein the source of the p-channel transistor 64 is connected to node 78 with the source of transistor 68 connected to a node 80. Similarly, the second inverter 76 comprises a p-channel transistor 66 and an n-channel transistor 70, wherein the source of transistor 66 is connected to a node 82 and the source of transistor 70 is connected to node 84. Furthermore, the gates of transistors 64 and 68 are connected together at a node 60 to form the input of the first inverter 74, and the drains of transistors 64 and 68 are connected together to form the output of the first inverter 74, which is further coupled at a node 62. Similarly, gates of transistors 66 and 70 are coupled together to form an input of the second inverter 76 at node 62 with the drains of transistors 66 and 70 being coupled together to form an output of the second inverter as further coupled to node 60.

Differential cross-coupled inverter circuit 72 forms a sensing portion of sense amplifier 32 and forms the appropriate switching circuitry for detecting a differential input and for switching differential cross-coupled inverter circuit 72 into a latched output state. It should be pointed out that in the present configuration as heretofore described, differential cross-coupled inverter circuit 72 has not been triggered or switched to generate a latched output, but rather the gates of the respective transistors have become precharged with the input signals.

It should be recalled that first and second differential data input signals 42 and 44 are received from devices, such as memory cell 26, which are operative over a first voltage range, namely, regulated power 34 (FIG. 2), which operates at a lower voltage than the interfacing devices that couple with first and second differential data outputs 52 and 54 of sense amplifier 32. Therefore, the output signals generated by sense amplifier 32 with its inherent level-shifting capability must be shifted in magnitude to a second voltage range, which is represented as the range between external power 36 (FIG. 2) and a reference signal such as ground. Therefore, sense amplifier 32 further comprises a level-shifting pull-up circuit 86 which shifts first and second differential data outputs 52 and 54 to a second voltage range, namely, the range defined by external power 36.

As depicted in FIG. 3, level-shifting pull-up circuit 86 is comprised, in one embodiment, of a first pull-up transistor 88 which couples to first inverter 74. More particularly, first pull-up transistor 88 is illustrated as a p-channel transistor with a drain coupled to node 78 of first inverter 74 and a source coupled to external power 36. Similarly, a second pull-up transistor 90 has a source that couples to node 82 and a drain that also couples with external power 36. Gates of both first and second pull-up transistors 88 and 90 are coupled together and are further coupled to a P-sense control signal 48. Operationally, first and second pull-up transistors 88 and 90, when activated by P-sense control signal 48, pull up their respective first and second cross-coupled inverters 74 and 76 from the first and second differential data inputs 42 and 44 to a generally larger external power 36.

In order to complete the electrical circuit inclusive of differential cross-coupled inverter circuit 72, sense amplifier 32 is further comprised of a pull-down circuit 92 which includes a transistor 94 coupled in an n-channel embodiment to the drain of transistor 94 with both nodes 80 and 84 of first and second cross-coupled inverters 74, 76. Upon activation of an N-sense control signal 50, transistor 94 completes the circuit between level-shifting pull-up circuit 86, differential cross-coupled inverter circuit 72 and pull-down circuit 92. Such a completion of the circuit enables first and second differential data inputs 42 and 44, which occur at a first voltage level, namely, the range as defined by regulated power 34, to be sensed by sense amplifier 32 and to be output by first and second differential data outputs 52 and 54 at a second voltage range, namely, the voltage range as defined by a level of external power 36.

Figure 1:
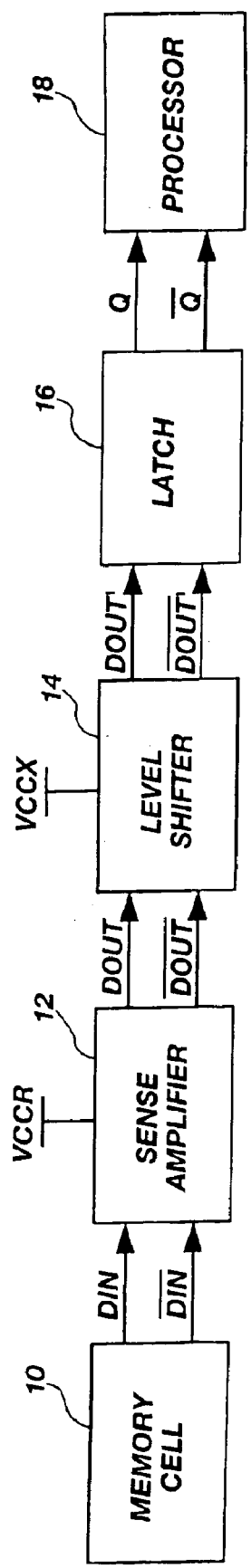
FIG. 1 illustrates a simplified block diagram, in accordance with the prior art.

By way of review, the discussion thus far, with regard to sense amplifier 32, has described first and second differential data inputs 42 and 44 as being received from a memory cell 26, or other similar data storage device, and being received at sense amplifier 32 at signal levels corresponding to regulated power, typically at a lower voltage range. The regulated power level inputs are synchronously clocked or passed into the sensing portion of sense amplifier 32 by way of pass gates 56 and 58 as controlled by pass gate control signal 46. The passing of the input signal into corresponding nodes 60 and 62 within differential cross-coupled inverter circuit 72 enables the charging of those nodes with respect to the differential polarity of the input signals. In order to decouple or otherwise isolate the load associated with other supporting circuitry, pass gate control signal 46 is deactivated, thereby opening transistors 56 and 58 and further releasing the support circuitry such as memory cell 26 (FIG. 2) from sustaining a valid, reliable input signal to sense amplifier 32. Charged nodes 60 and 62 await the sensing or strobing signals, namely, P-sense control signal 48 and N-sense control signal 50, in order to complete the sensing circuit allowing first and second differential data outputs 52 and 54 to assume their respective differential states. In order to mitigate the shortcomings and delays associated with the level-shifting processes of the prior art, as described above with respect to FIG. 1, sense amplifier 32 incorporates level-shifting capability through the use of level-shifting pull-up circuit 86 to provide a full voltage range as defined by external power 36.

It should be appreciated that first and second inputs to first and second cross-coupled inverters 74 and 76 have been pulled to a higher signal level, namely, a level corresponding to external power 36. Therefore, any subsequent sensing operation would subject any first and second differential data inputs 42 and 44, upon the activation of pass gate control signal 46, to become unreliable and, furthermore, could result in damage to any upstream circuitry such as memory cell 26 (FIG. 2). Therefore, a clamp circuit 96 provides a discharging or bleeding of charge associated with external power 36 down to an acceptable regulated power 34 prior to a subsequent sensing operation. Clamp circuit 96 is responsive to a clamp control signal 98 which is activated upon the conclusion of the sensing operation within sense amplifier 32 and is deactivated prior to a subsequent sensing operation. By way of example, clamp circuit 96 is comprised of a transistor 100 which has one of either a source or a drain coupled to a first inverter 74 input node 60 and the other one of either the source or drain coupled to the input of second inverter 76 at node 62. Transistor 100, in one embodiment, is implemented as a p-channel transistor with a gate coupled to clamp control signal 98. Clamp circuit 96 may further include a transistor 102 and a transistor 104, having their sources coupled to regulated power 34 and their drains respectively coupled to first and second inverter inputs, namely, nodes 60 and 62. The gates of both transistors 102 and 104 are coupled together and are further coupled to clamp control signal 98 and, when activated, serve to further bleed or discharge the voltage differential between external power 36, present at nodes 60 and 62 immediately following this sensing process.

Figure 4:
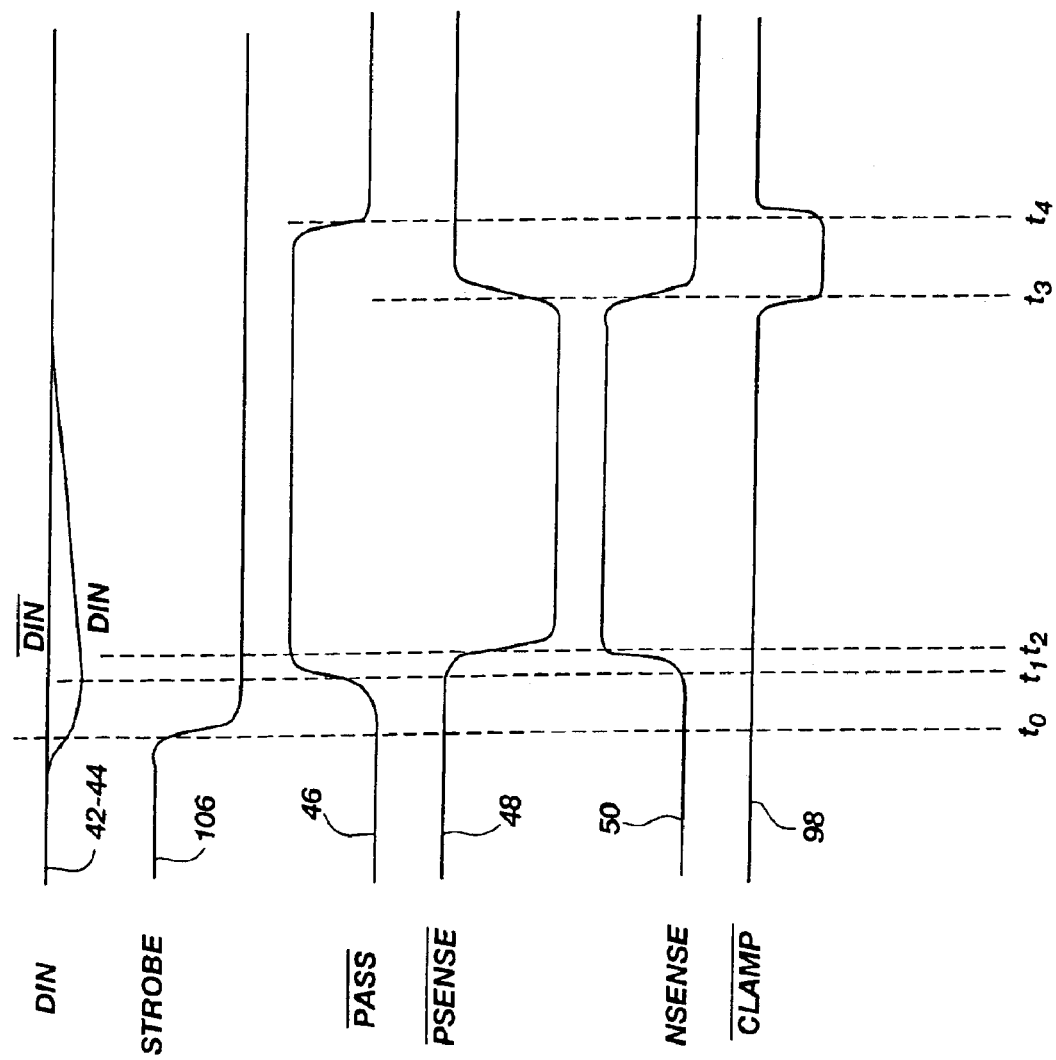
FIG. 4 is a timing diagram of the control and latching aspects of the sense amplifier, in accordance with an embodiment of the present invention.

FIG. 4 illustrates timing diagrams useful for describing the operation of sense amplifier 32. Prior to time $t_0$, the signals on the first and second differential data inputs 42 and 44 (FIG. 3) are output from a corresponding memory storage device such as a memory cell 26 (FIG. 2). At time $t_0$, a strobe signal 106 (FIG. 2) is received from a universal timing control 28 (FIG. 2) which coordinates the timing from memory cell 26 with sense amplifier 32. Strobe signal 106 (FIG. 2) initiates the timing associated with the other control signals of sense amplifier 32, and between time $t_0$ and $t_1$, first and second differential data inputs 42 and 44 "settle" into their respective differential states while pass gate control signal 46 maintains the activation of pass gates 56 and 58, thereby connecting memory cell 26 (FIG. 2) with level-shifting pull-up circuit 86 (FIG. 3).

At a time $t_1$, pass gate control signal 46 deactivates the respective pass gates, isolating the memory cell outputs operative at a lower regulated voltage (regulated power 34) from the higher voltage level-shifting pull-up circuit 86 (FIG. 3) operative on external power 36. Prior to time $t_2$, the input nodes, namely nodes 60 and 62, charge their respective gates of the differential cross-coupled inverter circuit 72 (FIG. 3) to facilitate the switching and locking of the transistors during the sensing process. At time $t_2$, the sensing signals, N-sense 50 and P-sense 48, transition to active states, thereby providing the respective "pulling-down" and "pulling-up" of differential cross-coupled inverter circuit 72 (FIG. 3). While the transition times of signals 46, 48 and 50 are illustrated as having discrete relational latency with respect to each other, simultaneous transitions are acceptable. At the conclusion of time $t_2$ followed by a nominal transistor transition time, first and second differential data outputs 52 and 54 output the corresponding level-shifted input signals at their corresponding logic values and desired level-shifting voltage range.

The time between $t_2$ and $t_3$ enables a latch or processor to further read or retain corresponding level-shifted differential data outputs prior to preparation of the sensing circuitry for a subsequent read operation. In preparation of a subsequent sensing and level-shifting operation, at a time $t_3$, clamp control signal 98 becomes active and "bleeds-off" at least the now-excessive portion of voltage and charge on first and second differential data outputs 52 and 54 that exceeds the regulated voltage levels. Such a node-conditioning process prevents any higher voltage from being transferred upstream to a lower voltage device such as a memory cell 26 when the pass gates are reactivated in a subsequent read operation. At a time $t_4$, clamp control signal 98 becomes deactivated as the differential data output signal levels have been reduced to compatible regulated power levels and pass gate control signal 46 may be reactivated with a subsequent read operation.

Figure 5:
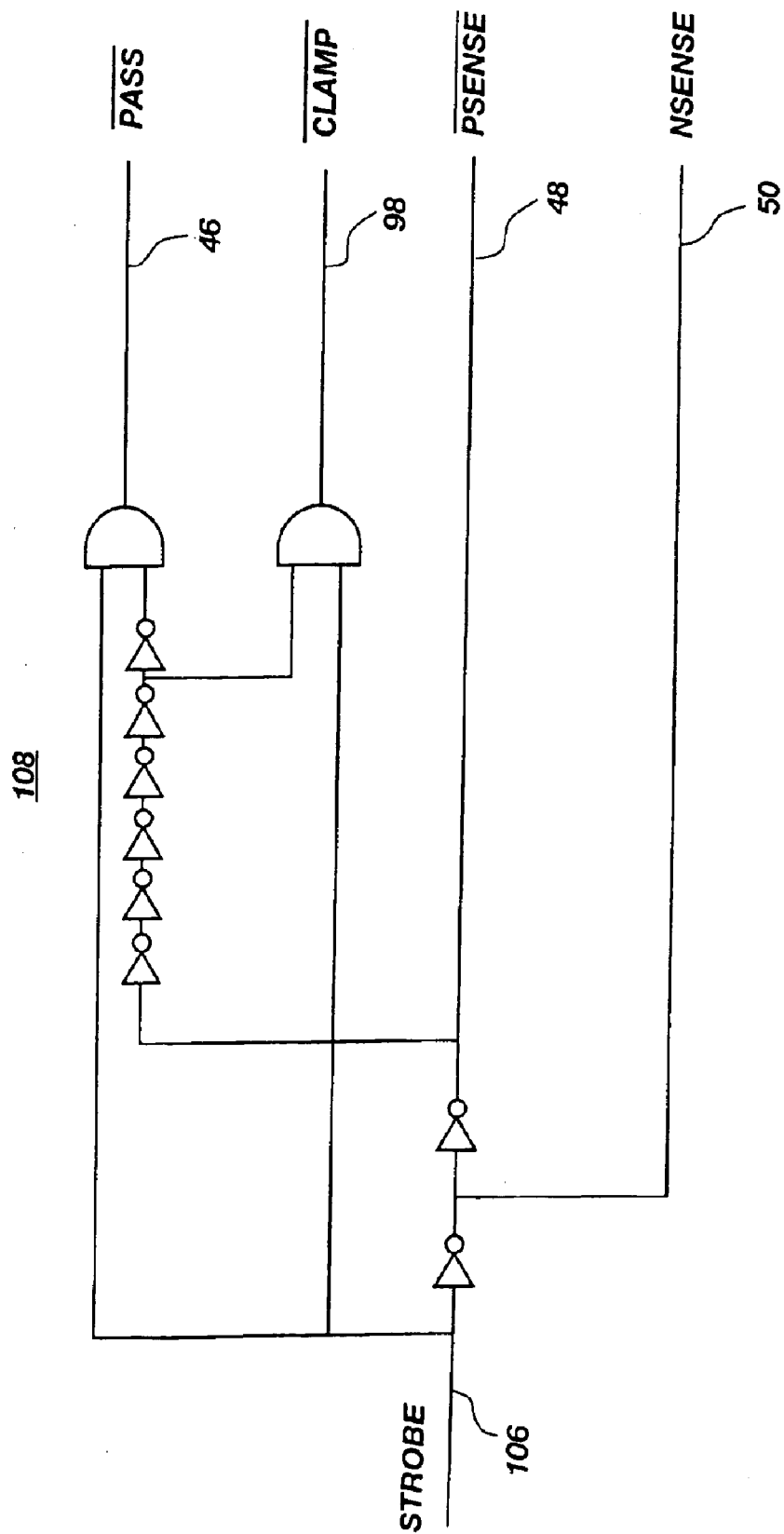
FIG. 5 is a timing control circuit, in accordance with the present invention.

FIG. 5 illustrates a timing control circuit for the generation of the various control signals described herein. More particularly, timing control circuit 108 receives a strobe signal 106 and through the various and respective gate delays and inversions generates control signals 46, 98, 48, and 50. Those of ordinary skill in the art appreciate that the various timing parameters described in the present invention may also be implemented using other control and gating mechanisms for the generation of the respective wave forms described above with regard to FIG. 4.

Figure 6:
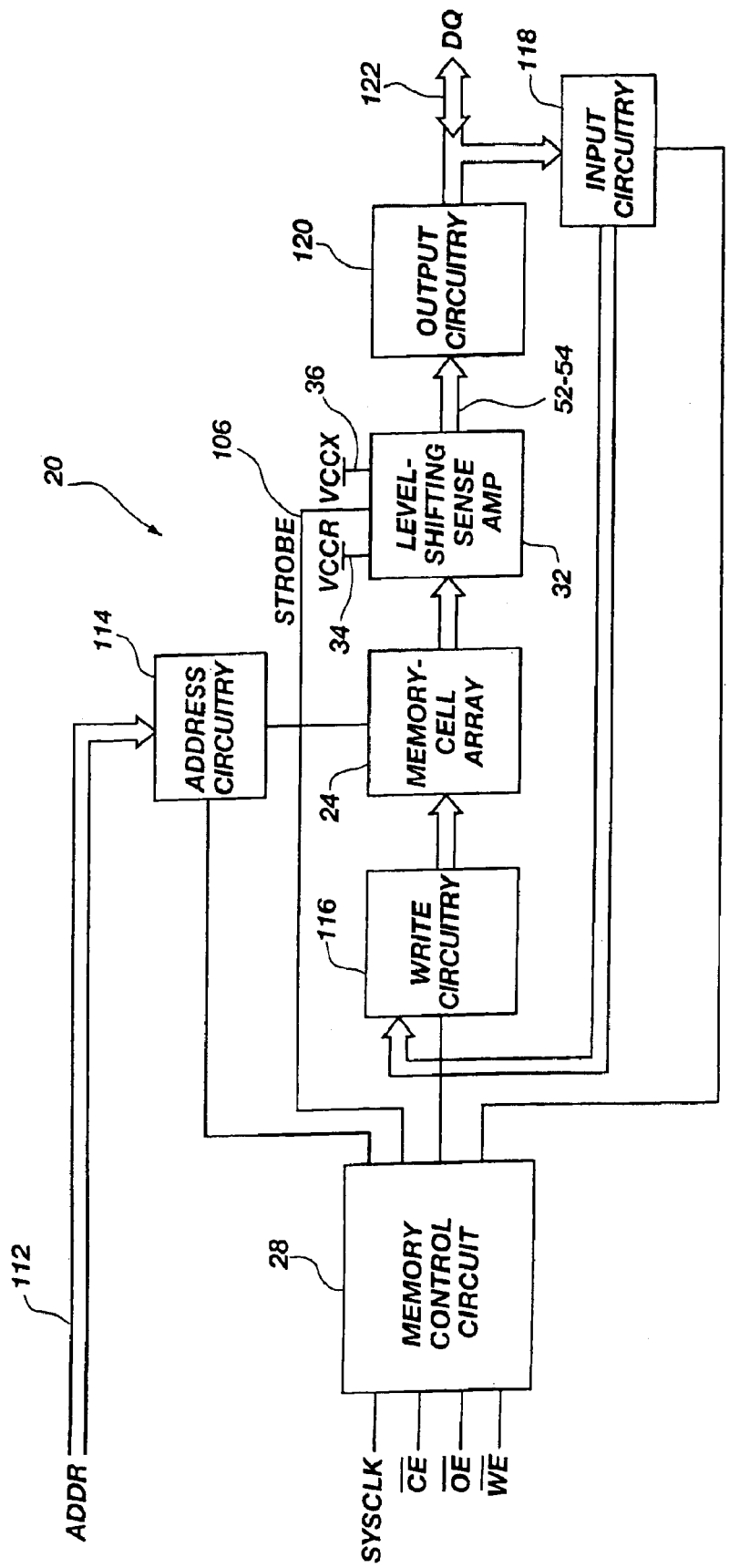
FIG. 6 illustrates a more detailed block diagram of a memory device or system, in accordance with the present invention.

FIG. 6 depicts one of many possible applications of the sense amplifier, in accordance with an embodiment of the present invention. FIG. 6 depicts a memory system 20 that includes a memory cell array 24 and operates in accordance with the plurality of internal control signals produced by a memory control circuit 28. A device external to the memory system 20 applies a plurality of command signals to the memory control circuit 28, including well-known signals such as write enable (WE), output enable (OE), and chip enable (CE). The memory control circuit 28 also receives the system clock signal SYSCLK. Those skilled in the art will understand that each of the depicted control signals may itself represent a plurality of associated control signals, and that additional well-known control signals may be included depending upon the particular type of memory system 20 (e.g., SRAM, DRAM, etc.).

An address ADDR is applied to the memory system 20 on an address bus 112. The address ADDR may be a single applied address, as in the case of an SRAM, or may be a time-multiplexed address, as in the case of a DRAM. In response to one or more control signals provided by the memory control circuit 28, address circuitry 114 decodes the address ADDR, selects corresponding locations within the memory cell array 24, and initiates access to these locations. As is known to those of ordinary skill in the art, the depicted address circuitry 114 includes a variety of functional components particular to the memory device type. For example, the address circuitry 114 might include an address burst controller and multiplexer circuitry, together with activation and address select circuitry appropriate to the particular memory device type.

In response to one or more control signals provided by the memory control circuit 28, write circuitry 116 writes data to address locations within the memory cell array 24. Those of ordinary skill in the art know that the depicted write circuitry 116 includes a variety of functional components particular to the memory device type. For example, the write circuitry 116 might include byte-enable circuitry and write driver circuitry. In response to one or more control signals provided by the memory control circuit 28, sense amplifier 32, in conjunction with address circuitry 114, receives data stored in the addressed locations within memory cell array 24. The operation of sense amplifier 32 is described above in response to the description of previous figures. In response to one or more control signals provided by memory control circuit 28, data input and data output circuits 118 and 120 are selectively connected to a data bus 122 to input and output data to and from memory system 20.

In accordance with an embodiment of the present invention, sense amplifier 32 utilizes both regulated power 34 and external power 36 for performing sensing and level-shifting functions. In particular, sense amplifier 32 steps-up the signal levels of the first and second differential data outputs 52 and 54 without requiring the additional time delay associated with a separate external level shifter following a sense amplifier.

Figure 7:
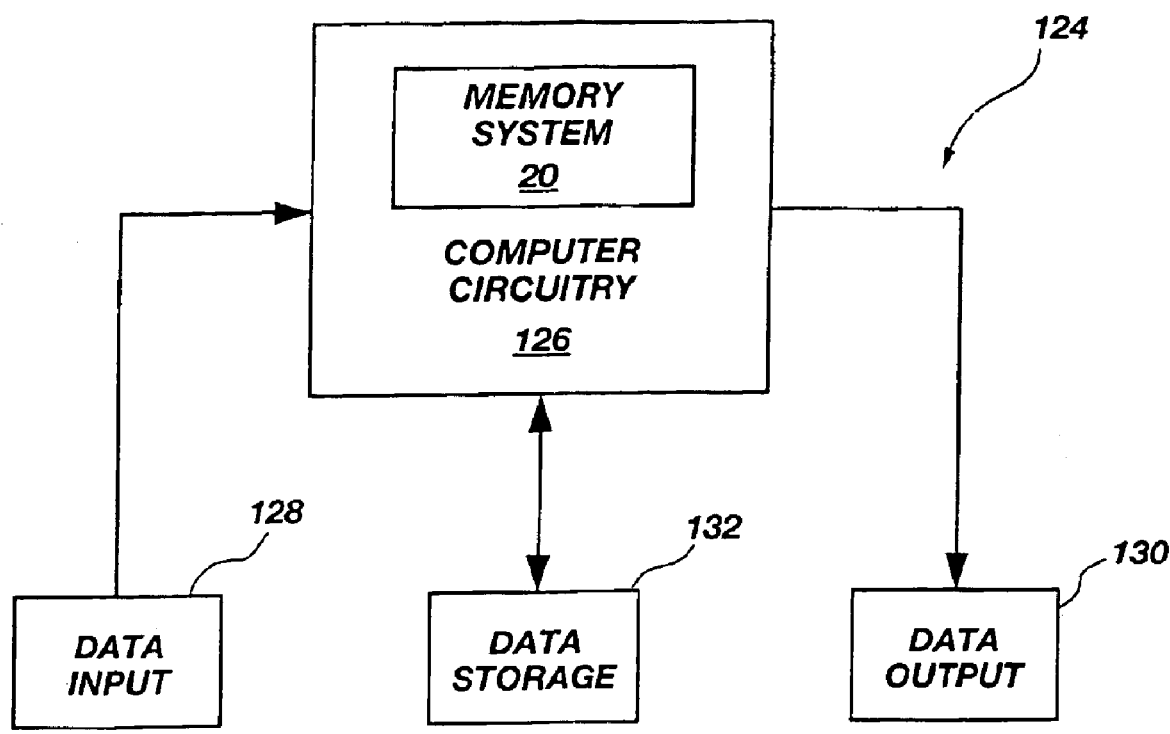
FIG. 7 is a simplified block diagram of a computer system having a memory device utilizing the present invention.

FIG. 7 is a functional block diagram depicting a computer system 124 which includes a memory system 20 constructed in accordance with the present invention. For example, the memory system 20 is configured to integrate the sense amplifier and associated circuitry described in connection with the previous figures. Computer system 124 includes computer circuitry 126 for performing such functions as executing software to accomplish desired calculations and tasks. The computer circuitry 126 includes at least one processor, such as processor 22 of FIG. 2, and the memory system 20, as shown. A data input device 128 is coupled to the computer circuitry 126 to facilitate the inputting of information into computer system 124. Data input devices include keyboards, pointing devices, and recognition devices including image and voice recognition. A data output device 130 is coupled to the computer circuitry 126 to present or output data generated by computer circuitry 126. Such data output devices include printers, displays, audible output devices, as well as others known and appreciated by those of skill in the art. A data storage device 132 is coupled to the computer circuitry 126 to store data and retrieve data from external storage media. Those of skill in the art appreciate that examples of such storage devices include disks, disk drives, removable media, and other storage formats appreciated in the art.

It is appreciated that, although specific embodiments of the present invention have been described above for purposes of illustration, various modifications may be made without deviating from the spirit and scope of the invention. While one example of a circuit implementation has been presented, modifications and functional substitutions for the particular level-shifting sense amplifier and the various memory systems, modules, devices and computer systems described herein are also contemplated. Accordingly, the invention is not limited by the disclosed embodiments, but, instead, the scope of the invention is determined by the following claims.

What is claimed is:

1. A sense amplifier having first and second differential data inputs and first and second differential data outputs, comprising:
    an inverter circuit including first and second inputs being within a first voltage range, the inverter circuit further including first and second outputs coupled to the first and second differential data outputs;
    a level-shifting circuit coupled to the inverter circuit and to a second voltage level, the level-shifting circuit for level-shifting the first and second differential data outputs of a second voltage range; and
    a clamp circuit coupled between the first and second differential data outputs for discharging from the second voltage range to the first voltage range following sensing and level-shifting of the first and second differential data inputs.

2. The sense amplifier, as recited in claim 1, further comprising first and second pass gates respectively coupled between the first and second differential data inputs and the first and second inputs of the inverter circuit for isolating the sense amplifier during level-shifting of the first and second differential data inputs.

3. The sense amplifier, as recited in claim 1, wherein the clamp circuit comprises a first clamp transistor coupled between the first and second differential data outputs for discharging from the second voltage range to the first voltage range.

4. The sense amplifier, as recited in claim 3, wherein the clamp circuit further comprises second and third clamp transistors, each coupled to one of the first and second differential data outputs in a pull-up configuration to a first voltage level within the first voltage range.

5. The sense amplifier, as recited in claim 1, wherein the inverter circuit comprises:
    a first inverter including a first inverter input coupled to the first differential data input, the first inverter further including a first inverter output coupled to the second differential data output; and
    a second inverter including a second inverter input coupled to the second differential data input, the second inverter further including a second inverter output coupled to the first differential data output, the first inverter output coupled to the second inverter input and the second inverter output coupled to the first inverter input.

6. The sense amplifier, as recited in claim 5, wherein the first and second inverters are CMOS inverters.

7. The sense amplifier, as recited in claim 1, wherein the level-shifting circuit includes at least one p-channel transistor and an n-channel transistor.

8. The sense amplifier, as recited in claim 1, wherein the level-shifting circuit, when activated, enables the first and second differential data outputs to swing within the second voltage range.

9. The sense amplifier, as recited in claim 1, further comprising a timing control circuit for generating control signals for activating the level-shifting circuit of the sense amplifier in response to a read operation of a memory cell.

10. A sense amplifier for use in a static random access memory, the memory including an array of memory cells with the memory cells for coupling to the sense amplifier via first and second differential data inputs operative within a first voltage range, comprising:
    a first CMOS inverter having a first output and a first input for coupling with the first differential data input;
    a second CMOS inverter having a second output and a second input for coupling with the second differential data input, the second input coupled to the first output of the first CMOS inverter, the first input of the first CMOS inverter coupled to the second output of the second CMOS inverter;
    a level-shifting circuit coupled to the first and second CMOS inverters and further coupled to a second voltage level for level-shifting the first and second differential data inputs within the first voltage range to first and second differential data outputs of a second voltage range; and
    a clamp circuit coupled between the first and second differential data outputs for discharging from the second voltage range to the first voltage range following sensing and level-shifting of the first and second differential data inputs.

11. The sense amplifier, as recited in claim 10, wherein the clamp circuit comprises a first clamp transistor coupled between the first and second differential data outputs for discharging from the second voltage range to the first voltage range.

12. The sense amplifier, as recited in claim 10, wherein the level-shifting circuit includes at least one p-channel transistor and an n-channel transistor.

13. A memory system, comprising:
    a memory cell array operative over a first voltage range; and
    a sense amplifier including first and second differential data inputs and outputs, the sense amplifier coupled to the memory cell array via the first and second differential data inputs, the sense amplifier for sensing data resident within the memory cell array and for level-shifting the data to a second voltage range, the sense amplifier including:
        an inverter circuit including first and second inputs for coupling with a memory cell of the memory cell array, the first and second inputs being within the first voltage range, the inverter circuit further including first and second outputs coupled to the first and second differential data outputs;
        a level-shifting circuit coupled to the inverter circuit and to a second voltage level, the level-shifting circuit for level-shifting the first and second inputs within the first voltage range to the first and second differential data outputs of a second voltage range; and
        a clamp circuit coupled between the first and second differential data outputs for discharging from the second voltage range to the first voltage range following sensing and level-shifting of the first and second differential data inputs.

14. The memory system, as recited in claim 13, wherein the sense amplifier further comprises first and second pass gates respectively coupled between the first and second differential data inputs and the first and second inputs of the inverter circuit for isolating the sense amplifier from the memory cell array during level-shifting of the first and second differential data inputs.

15. The memory system, as recited in claim 13, wherein the clamp circuit comprises a first clamp transistor coupled between the first and second differential data outputs discharging from the second voltage range to the first voltage range.

16. The memory system, as recited in claim 15, wherein the clamp circuit further comprises second and third clamp transistors, each coupled to one of the first and second differential data outputs in a pull-up configuration to a first voltage level within the first voltage range.

17. The sense amplifier, as recited in claim 16, further comprising first and second pass gates respectively coupled between the first and second differential data inputs and the first and second inputs of the first and second CMOS inverters for isolating the memory during sensing and level-shifting.

18. The memory system, as recited in claim 13, wherein the inverter circuit comprises:
   a first inverter including a first inverter input coupled to the first differential data input, the first inverter further including a first inverter output coupled to the second differential data output; and
   a second inverter including a second inverter input coupled to the second differential data input, the second inverter further including a second inverter output coupled to the first differential data output, the first inverter output coupled to the second inverter input and the second inverter output coupled to the first inverter input.

19. A computer system, comprising:
   a data input device;
   a data output device;
   a processor coupled to the data input device and the data output device; and
   a memory system coupled to the processor for storing data therein, the memory system including:
      a memory cell array operative over a first voltage range; and
      a sense amplifier including first and second differential data inputs and outputs, the sense amplifier coupled to the memory cell array via the first and second differential data inputs, the sense amplifier for sensing data resident within the memory cell array and for level-shifting the data to a second voltage range, the sense amplifier including:
         an inverter circuit including first and second inputs for coupling with a memory cell of the memory cell array, the first and second inputs being within the first voltage range, the inverter circuit further including first and second outputs coupled to the first and second differential data outputs;
         a level-shifting circuit coupled to the inverter circuit and to a second voltage level, the level-shifting circuit for level-shifting the first and second inputs within the first voltage range to the first and second differential data outputs of the second voltage range; and
         a clamp circuit coupled between the first and second differential data outputs for discharging from the second voltage range to the first voltage range following sensing and level-shifting of the first and second differential data inputs.

20. The computer system, as recited in claim 19, wherein the sense amplifier further comprises:
   first and second pass gates respectively coupled between the first and second differential data inputs and the first and second inputs of the inverter circuit for isolating the sense amplifier from the memory cell array during level-shifting of the first and second differential data inputs.

21. The computer system, as recited in claim 19, wherein the clamp circuit comprises a first clamp transistor coupled between the first and second differential data outputs discharging from the second voltage range to the first voltage range.

22. The computer system, as recited in claim 21, wherein the clamp circuit further comprises second and third clamp transistors, each coupled to one of the first and second differential data outputs in a pull-up configuration to a first voltage level within the first voltage range.

23. The computer system, as recited in claim 19, wherein the inverter circuit comprises:
   a first inverter including a first inverter input coupled to the first differential data input, the first inverter further including a first inverter output coupled to the second differential data output; and
   a second inverter including a second inverter input coupled to the second differential data input, the second inverter further including a second inverter output coupled to the first differential data output, the first inverter output coupled to the second inverter input and the second inverter output coupled to the first inverter input.

24. A method of level-shifting input signals of a first voltage range to output signals of a second voltage range, comprising:
   charging inputs of an inverter pair with the input signals of the first voltage range;
   isolating the inputs from a source of the input signals;
   electrically pulling up at one end of the inverter pair to the second voltage range and together pulling another end of the inverter pair down to form the second voltage range about the output signals when the inverter pair transitions to a latched state in response to the input signals; and
   discharging the output signals from the second voltage range to the first voltage range in preparation for a subsequent cycle.

* * * * *